(12) United States Patent
Jeon et al.

(10) Patent No.: US 6,919,828 B2
(45) Date of Patent: Jul. 19, 2005

(54) VARIABLE LENGTH CODING AND DECODING METHODS AND APPARATUSES USING PLURAL MAPPING TABLES

(75) Inventors: Byeung-woo Jeon, Seongnam-si (KR); Kook-yeol Yoo, Suwon-si (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 879 days.

(21) Appl. No.: 09/858,872

(22) Filed: May 17, 2001

(65) Prior Publication Data

US 2002/0009153 A1 Jan. 24, 2002

(30) Foreign Application Priority Data

May 17, 2000 (KR) ........................................ 2000-26274

(51) Int. Cl.[7] .......................... H03M 7/40; H03M 7/00
(52) U.S. Cl. ........................................ 341/67; 341/106
(58) Field of Search ................... 341/67, 106; 370/389; 375/240.03; 382/239, 246; 704/204; 710/30

(56) References Cited

U.S. PATENT DOCUMENTS

| | | | | |
|---|---|---|---|---|
| 3,694,813 A | * | 9/1972 | Loh et al. ....................... | 710/30 |
| 4,044,347 A | * | 8/1977 | Van Voorhis ................. | 341/67 |
| 5,793,897 A | * | 8/1998 | Jo et al. ....................... | 382/246 |
| 5,828,426 A | | 10/1998 | Yu | |
| 5,831,559 A | * | 11/1998 | Agarwal et al. ............. | 341/106 |
| 6,011,499 A | * | 1/2000 | Agarwal et al. .............. | 341/67 |
| 6,111,914 A | * | 8/2000 | Bist ........................ | 375/240.03 |
| 6,118,822 A | * | 9/2000 | Bist ........................ | 375/240.03 |
| 6,552,674 B2 | * | 4/2003 | Cheung et al. ................ | 341/67 |
| 6,570,876 B1 | * | 5/2003 | Aimoto ........................ | 370/389 |
| 6,636,830 B1 | * | 10/2003 | Princen et al. .............. | 704/204 |
| 6,668,088 B1 | * | 12/2003 | Werner et al. .............. | 382/239 |
| 6,668,094 B1 | * | 12/2003 | Yoo et al. .................... | 382/246 |

FOREIGN PATENT DOCUMENTS

| | | |
|---|---|---|
| CN | 1071526 C | 9/2001 |
| EP | 0 574 746 A1 | 12/1993 |
| EP | 0 708 551 A2 | 4/1996 |
| EP | 0 987 900 A2 | 3/2000 |
| JP | 4-239225 | 8/1992 |
| JP | 6-225286 | 8/1994 |
| JP | 8-46521 | 2/1996 |
| JP | 2898757 | 3/1999 |
| JP | 2000-13794 | 1/2000 |
| JP | 2001-525639 | 12/2001 |
| WO | WO 99/29115 A1 | 6/1999 |

OTHER PUBLICATIONS

Patent abstracts of japan vol. 2000, No. 04, Aug. 31, 2000 (JP 2000 013794 A (Mitsubishi electric corp.).

\* cited by examiner

*Primary Examiner*—Patrick Wamsley
(74) *Attorney, Agent, or Firm*—Sughrue Mion, PLLC

(57) ABSTRACT

A mapper-based variable length coding method and decoding method and apparatuses therefor are provided. The mapper-based variable length coding method includes an inputting step for receiving symbol data to be coded and receiving element type information on the kind of symbol data, a coding step for generating a first code number corresponding to the received symbol data, a mapping step for selecting a second code number mapped with respect to selected element type information in mapping tables formed of second code numbers, each of which is appropriately mapped according to the first code number and the element type information, a codeword extracting step for generating a codeword corresponding to the selected second code number, and an outputting step for outputting the generated codeword. According to the methods and apparatuses, the advantages of a universal variable length code table can be maintained while preventing efficiency lowering of compression coding.

17 Claims, 7 Drawing Sheets

```
                            1
                   0    x₀   1
              0   x₁   0    x₀   1
         0   x₂   0   x₁   0    x₀   1
    0   x₃   0   x₂   0    x₁   0   x₀   1
```

| CODE NUMBER | CODEWORD |
|---|---|
| 0 | 1 |
| 1 | 0 0 1 |
| 2 | 0 1 1 |
| 3 | 0 0 0 0 1 |
| 4 | 0 0 0 1 1 |
| 5 | 0 1 0 0 1 |
| 6 | 0 1 0 1 1 |
| 7 | 0 0 0 0 0 0 1 |
| 8 | 0 0 0 0 0 1 1 |
| 9 | 0 0 0 1 0 0 1 |
| 10 | 0 0 0 1 0 1 1 |
| 11 | 0 1 0 0 0 0 1 |
| . . . . . . | . . . . . . |

FIG. 4
PRIOR ART

| ELEMENT TYPE / CODE NUMBER | MB-TYPE | CBP | | TCOEFF_CHROME_DC | | TCOEFF_CHROME_AC TCOEFF_LUMA SIMPLE_SCAN | | TCOEFF_LUMA DOUBLE_SCAN | |
|---|---|---|---|---|---|---|---|---|---|
| | | INTRA | INTER | INTRA | INTER | LEVEL | RUN | LEVEL | RUN |
| 0 | Skip | 47 | 0 | EOB | – | EOB | – | EOB | – |
| 1 | 16x16 | 31 | 16 | 1 | 0 | 1 | 0 | 1 | 0 |
| 2 | 16x8 | 15 | 1 | –1 | 0 | –1 | 0 | –1 | 0 |
| 3 | 8x16 | 0 | 2 | 2 | 0 | 1 | 1 | 1 | 1 |
| 4 | 8x8 | 23 | 4 | –2 | 0 | –1 | 1 | –1 | 1 |
| 5 | 8x4 | 27 | 8 | 1 | 1 | 1 | 2 | 2 | 0 |
| 6 | 4x8 | 29 | 32 | –1 | 1 | –1 | 2 | –2 | 0 |
| 7 | 4x4 | 30 | 3 | 3 | 0 | 2 | 0 | 1 | 2 |
| 8 | Intra | 7 | 5 | –3 | 0 | –2 | 0 | –1 | 2 |
| 9 | | 11 | 10 | 2 | 1 | 1 | 3 | 3 | 0 |
| 10 | | 13 | 12 | –2 | 1 | –1 | 3 | –3 | 0 |
| 11 | | 14 | 15 | 1 | 2 | 1 | 4 | 4 | 0 |
| 12 | | 39 | 47 | –1 | 2 | –1 | 4 | –4 | 0 |
| 13 | | 43 | 7 | 1 | 3 | 1 | 5 | 5 | 0 |
| 14 | | 45 | 11 | –1 | 3 | –1 | 5 | –5 | 0 |
| 15 | | 46 | 13 | 4 | 0 | 3 | 0 | 1 | 3 |
| 16 | | 16 | 14 | –4 | 0 | –3 | 0 | –1 | 3 |
| 17 | | 3 | 6 | 3 | 1 | 2 | 1 | 1 | 4 |
| 18 | | 51 | 9 | –3 | 1 | –2 | 1 | –1 | 4 |
| 19 | | 10 | 31 | 2 | 2 | 2 | 2 | 2 | 1 |
| 20 | | 12 | 35 | –2 | 2 | –2 | 2 | –2 | 1 |
| 21 | | 19 | 37 | 2 | 3 | 1 | 6 | 3 | 1 |
| 22 | | 21 | 42 | –2 | 3 | –1 | 6 | –3 | 1 |
| 23 | | 26 | 44 | 5 | 0 | 1 | 7 | 6 | 0 |
| 24 | | 28 | 33 | –5 | 0 | –1 | 7 | –6 | 0 |
| 25 | | 35 | 34 | 4 | 1 | 1 | 8 | 7 | 0 |
| 26 | | 37 | 36 | –4 | 1 | –1 | 8 | –7 | 0 |
| 27 | | 42 | 40 | 3 | 2 | 1 | 9 | 8 | 0 |
| 28 | | 44 | 39 | –3 | 2 | –1 | 9 | –8 | 0 |
| 29 | | 1 | 43 | 3 | 3 | 4 | 0 | 9 | 0 |
| 30 | | 2 | 45 | –3 | 3 | –4 | 0 | –9 | 0 |
| .. | | | | .. | .. | .. | .. | .. | .. |

FIG. 6A

| CODE NUMBER A \ CODE NUMBER B | Qp=1 | Qp=5 | Qp=10 | ... | Qp=31 |
|---|---|---|---|---|---|
| 0 | 5 | 3 | 1 | ... | 0 |
| 1 | 3 | 2 | 2 | ... | 1 |
| 2 | 2 | 0 | 5 | ... | 2 |
| 3 | 1 | 4 | 0 | ... | 3 |
| 4 | 0 | 1 | 4 | ... | 4 |
| 5 | 4 | 5 | 3 | ... | 5 |
| ... | | | | ... | |

FIG. 6B

| CODE NUMBER | UVLC | MB TYPE Qp=1 | Qp=15 | Qp=28 |
|---|---|---|---|---|
| 0 | skip(1) | 16x16(1) | skip(1) | skip(1) |
| 1 | 16x16(3) | 4x4(3) | 16x16(3) | 16x18(3) |
| 2 | 16x8(3) | skip(3) | 4x8(3) | 8x16(3) |
| 3 | 8x16(5) | 8x4(5) | 4x4(5) | 16x8(5) |
| 4 | 8x8(5) | 4x8(5) | 8x16(5) | Intra(5) |
| 5 | 8x4(5) | 8x8(5) | 8x4(5) | 4x8(5) |
| 6 | 4x8(5) | 16x8(5) | 16x8(5) | 8x8(5) |
| 7 | 4x4(7) | 8x16(7) | 8x8(7) | 8x4(7) |
| 8 | | intra(7) | intra(7) | 4x4(7) |
| 9 | intra(7) | | | |

VARIABLE LENGTH CODING AND DECODING METHODS AND APPARATUSES USING PLURAL MAPPING TABLES

BACKGROUND OF THE INVENTION

1. Field of the Invention

The present invention relates to a variable length coding method, a variable length decoding method, and apparatuses therefor, and more particularly, to a variable length coding method and a variable length decoding method, in which a plurality of mapping tables are used so that the advantages of a universal variable length code table can be maintained and efficiency lowering of compression coding can be prevented, and apparatuses therefor. The present application is based on Korean Application No. 2000-26274, filed May 17, 2000, which is incorporated herein by reference.

2. Description of the Related Art

At present, the International Telecommunication Union Telecommunication Standardization Sector (ITU-T) has been working on an H.26L international standard related to the next generation of videophones. Although a series of moving picture coding methods related to videophones, such as H.261, H.263, H.263+, and later H.263++ and MPEG-4, were determined as ITU-T international standards, these international standards cannot meet newly appearing requirements. Therefore the H.26L standard is being prepared in order to cope with the new requirements. The new requirements are as follows.

The first requirement is for more improved coding efficiency and shorter end-to-end delay for ultra low-speed real-time applications. That is, it is a requirement for realizing a more enhanced frame rate than that of H.263+ base coding method at the same bit rate, and a requirement for realizing the picture quality obtained by using the H.263+ base coding method at a bit rate less than half the bit rate of the base coding method. The requirement is needed also from the aspect of coding delay. For example, the delay should be short enough to satisfy real-time interactive communication, and should be flexible enough to easily reduce delay time to less than a target delay time, at the cost of lowering picture quality if necessary. For future general usability, the second requirement is for complexity low enough to code/decode using only software. The third requirement is for an error tolerance and solidarity capable of coping with about $10^{-4}$ sporadic errors and about $10^{-3}$ crowding errors. Other new requirements include a requirement for a structure that is capable of easily coping with network environments, such as video streaming, a requirement for providing higher picture quality or entertainment quality of a main application at 8~12 Kbps bit rate, a requirement for a scalability function of space, time, and SNR, a requirement for an intra coding function for random access of storage medium-based applications, a requirement for capability of reverse-direction prediction, etc. Particularly, in entropy coding of future low transmission coding, when a Huffman variable length coding method with a conventional Huffman coding table is used, the growing trend is wide use of a universal variable length coding table regardless of the types of coding data, in order to make the design simpler and clearer. This is to reduce the complexity of a processing method and apparatus caused by having a plurality of variable length coding tables, as in prior art. However, although the universal variable length coding table may reduce complexity of a processing method and apparatus, it causes a lower coding efficiency.

FIG. 1 illustrates the structure of a decoding apparatus using prior art.

A decoding unit 10 of FIG. 1 receives a coded bit stream (coded data), which is coded in a coding apparatus (not shown) and is formed of "0" and "1". The decoding unit 10 divides each codeword from the received bit stream and then outputs code numbers, each corresponding to a distinct codeword. The method for dividing each codeword from the received bit stream will be explained later. A symbol extracting unit 11 receives a code number corresponding to each codeword and an element type signal for determining the kind of symbol, and outputs the corresponding symbol in the form of decoded data.

The decoding step of the decoding unit 10 will now be explained. The decoding unit 10 uses a universal variable length coding table (UVLC), and the UVLC is formed using the rule shown in FIG. 2. Here, $X_n$ has a value of "0" or "1". If information to be coded is INFO, it can be expressed as INFO=$X_n$ ... $X_1 X_0$. This INFO data is made to be a bit stream as shown in FIG. 2, in which every odd numbered bit is "0" except the last bit which is "1". At this time, the length of the final codeword, which is made from INFO with insertion as shown in FIG. 2, is obtained by adding "1" to twice the number of bits of INFO, except when a code number is "0". The codeword thus formed can be numbered in the direction of increasing length, and at this time, the number is referred to as a code number. An example is shown in FIG. 3. At this time, the relation between code number and INFO to be inserted can be expressed as the following equation 1:

$$\text{code\_number} = 2^{L/2} + \text{INFO} \tag{1}$$

Here, L is the length of a codeword, and as described above, the length is obtained by adding "1" to twice the length of INFO, except when a code number is "0". In an example of the above rule, if a binary number "10" is provided as INFO, L is "5" and the code number is "5".

Decoding can be very easily performed using this rule in reverse. That is, a UVLC table formed as described above has a predetermined characteristic in that an odd numbered bit of each codeword is always the binary number "0", except for the last bit of each codeword which is always the binary number "1". Therefore, the decoding apparatus 10 of FIG. 1 refers to odd numbered bits of an input bit stream, and if the binary number "1" is found, it can be determined that the bits up to the binary number "1" correspond to one codeword. After one codeword is found in this way, only even numbered bits in the found codeword are read, and those bits form a code number. This step is performed by the decoding apparatus 10 of FIG. 1.

If the decoding apparatus 10 of FIG. 1 outputs the code number, it needs to decode an actual symbol corresponding to the code number, that is, a symbol corresponding to the found INFO. Decoding is simply performed with reference to a table by a symbol extracting unit 11 of FIG. 1. That is, the symbol extracting unit 11 stores, for example, data as shown in FIG. 4. That is, if a code number and an element type (element_type), which indicates the kind of symbol, are received, the symbol extracting unit 11 outputs a symbol corresponding to the code number and the element type, and by doing so, performs decoding. Here, an example of element_type is MB-TYPE information which indicates the type of a macro block currently being decoded. As shown in FIG. 4, MB-TYPE information can be a skip type, which indicates substitution of video data of a corresponding location of a reference video for a motion vector, or can specify the size and form of a macro block, such as 16×16, 16×8, 8×16, 8×4, etc.

The conventional method described above has the following drawbacks. One kind of UVLC table is used for a plurality of symbols (for example, MT_TYPE, CBP(coded block pattern), . . . ). The compression efficiency of the variable length coding method is closely related to how well a codeword table is designed according to the probability distribution of symbols which are actually used. However, in the conventional method described above, although complexity in implementation is reduced by using a universal codeword table, code numbers and symbols are mapped to each other uniformly by a UVLC table, as shown in FIG. 4, regardless of the probability distribution of the actual symbols, and therefore the conventional method has a serious problem realizing the basic goal of maximum compression. That is, the UVLC table described above can be appropriate for certain kinds of symbols, but can cause lowered coding efficiency for other kinds of symbols. To solve this problem, a table optimized for each kind of symbol can be prepared to improve the efficiency, but in this case, the beneficial effects of the UVLC described above are sacrificed.

SUMMARY OF THE INVENTION

To solve the above problems, it is a first object of the present invention to provide an effective coding method, which can maintain the advantages of a universal variable length code (UVLC) table and prevent lowering of compression coding, and a coding apparatus thereof.

It is a second object to provide an effective decoding method, which can maintain the advantages of a universal variable length code (UVLC) table and prevent lowering of compression coding, and a decoding apparatus thereof.

To accomplish the first object of the present invention, there is provided a variable length coding method for coding data, the method having an inputting step for receiving symbol data to be coded and receiving element type information on the kind of symbol data; a coding step for generating a first code number corresponding to the received symbol data; a mapping step for selecting a second code number, mapped with respect to the input element type information, in mapping tables formed of second code numbers, each of which is appropriately mapped according to first code numbers and element type information; a codeword extracting step for generating a codeword corresponding to the selected second code number; and an outputting step for outputting the generated codeword.

It is preferable that in the mapping step, one among one or more mapping tables, each of which corresponds to quantization step (Qp) information corresponding to the symbol data is selected, and the second code number is generated from the selected table.

It is preferable that in the mapping step one among one or more mapping tables is selected based on information containing at least quantization step (Qp) information, among multiple units of element type information corresponding to the symbol data, and the second code number is generated from the selected table.

It is preferable that in the mapping step, the second code number is selected using a mapping table, which makes the least number of generated bits among one or more mapping tables.

It is preferable that a plurality of mapping tables in the mapping step are optimized using a large amount of training data in advance.

To accomplish another aspect of the first object of the present invention, there is also provided a variable length decoding method for decoding data, the method having an inputting step for receiving coded data and element type information containing information on the kinds of coded data; a decoding step for generating a first code number corresponding to the coded data; a mapping step for receiving the element type information, selecting one among one or more mapping tables, each of which corresponds to the first code according to element type information, and generating a second code number corresponding to the first code number by using the selected mapping table.

It is preferable that in the mapping step, one among one or more mapping tables is selected based on information containing at least quantization step (Qp) information among the element type information corresponding to the symbol data, and the second code number is generated.

It is preferable that one or more mapping tables in the mapping step are optimized using a large amount of training data in advance.

To accomplish an aspect of the second object of the present invention, there is also provided a variable length coding apparatus for coding data, the apparatus having a coding unit for receiving symbol data to be coded, receiving element type information on the kind of the symbol data, and generating a first code number; a mapper unit for receiving the element type information, and generating a second code number corresponding to the first code number in one mapping table among one or more mapping tables corresponding to the element type information; and a codeword generating unit for generating a codeword corresponding to the second code number and outputting the codeword in the form of coded data.

To accomplish another aspect of the second object of the present invention, there is also provided a variable length decoding apparatus for decoding coded data, the apparatus having a decoding unit for receiving coded data, receiving element type information containing information on the kind of coded data, and outputting a first code number; a mapper unit for receiving the element type information, selecting one among one or more mapping tables, each of which corresponds to one element type, and converting the first code number into a second code number by using the selected table; and a symbol extracting unit for outputting a symbol corresponding to the second code number.

BRIEF DESCRIPTION OF THE DRAWINGS

The above objects and advantages of the present invention will become more apparent by describing in detail a preferred embodiment thereof with reference to the attached drawings in which:

FIG. 4 is a table showing an example of the mapping relation between a symbol and a code number;

FIG. 6A is an example of the mapping structure of a mapper for a macro block (MB) type of FIG. 5;

FIG. 6B is an example of mapping between macro block type symbols and actual code numbers;

DETAILED DESCRIPTION OF THE INVENTION

Hereinafter, embodiments of the present invention will be described in detail with reference to the attached drawings. The present invention is not restricted to the following embodiments, and many variations are possible within the spirit and scope of the present invention. The embodiments of the present invention are provided in order to more completely explain the present invention to anyone skilled in the art.

Figures 1, 2, 3:
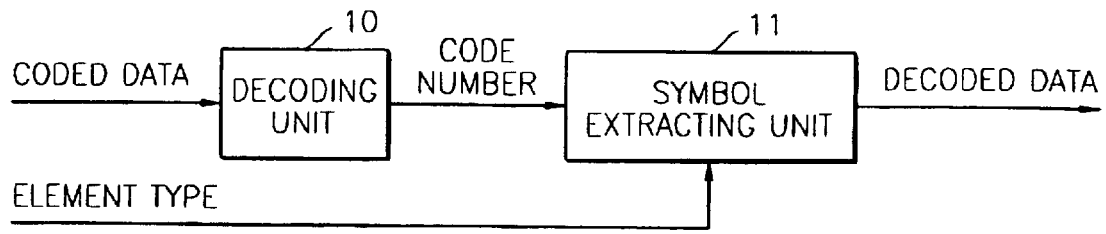
FIG. 1 illustrates the structure of the conventional variable length decoding apparatus.
FIG. 2 is an example of a principle of forming a universal variable length coding (UVLC) table.
FIG. 3 illustrates the relation between a code number and a codeword of a UVLC table.
Figure 5:
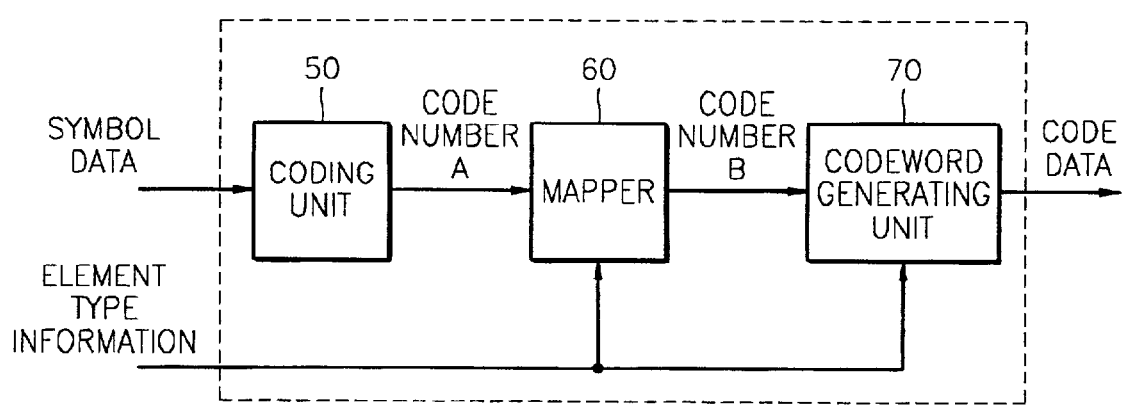
FIG. 5 illustrates the structure of a mapper-based variable length coding apparatus of the present invention.

FIG. 5 is a block diagram showing the structure of a coding apparatus of an embodiment of the present invention. The coding apparatus is formed of a coding unit 50, a mapper unit 60, and a codeword generating unit 70. The operation of the coding apparatus of the present invention will now be explained.

First, the operation of a mapper-based variable length coding apparatus of FIG. 5 will now be explained. Symbol data to be coded and element type information, which is information on the type of symbol, are input to the coding unit 50 of the present invention. At this time, in general, element type information indicates the syntax element of a symbol currently coded (that is, indicates the kind of a symbol). More generally, element type information indicates various related syntax element information of a unit of data currently coded. For example, element type information can be information on symbol data currently encoded, including information on macro block type, such as size and shape, information on whether or not motion compensation is performed, information on whether the data is brightness information or color information, or information on whether the data is the DC component or AC component of a DCT coefficient. The coding unit 50 generates and outputs a code number using INFO bits corresponding to a symbol to be coded, and the code number will be referred to as code number A. The output code number is converted into code number B by the mapper unit 60 of the present invention. To explain this process, FIG. 6A, which is an example of the structure of the mapper 60 for a macro block (MB) type, will be referred to.

An example of decoding an "MB" type of symbol will be explained. However, the method is not limited to a certain element type and can be applied to any arbitrary element type to be coded by the coding apparatus. Here, for convenience, only an example of "MB" type will be explained. Code number A output by the coding unit 50 is a code number corresponding to a symbol to be coded. However, according to coding conditions, the relative probability of occurrence of a symbol changes greatly. That is, when a UVLC table, as shown in FIG. 6A, was designed, it was thought that a symbol corresponding to code number 2 would occur more frequently than a symbol corresponding to code number 5. In reality, the symbol corresponding to code number 5 may occur more frequently. This can be easily checked by experiments. The actual observational result is shown in FIG. 6B. In FIG. 6B, each number in parentheses indicates the length of the codeword corresponding to a symbol. The column UVLC indicates the symbol corresponding to a code number of the first column. That is, in the ULVC table, the codeword of code number 1 is assigned to a 16×16 symbol of the MB type, and at this time the length of the codeword is 3 bits. Qp indicates a quantization interval. In each column, marked by Qp=1, Qp=15, and Qp=28, there are symbols which are generated by using a given Qp value and are arranged by decreasing order of frequency. For example, in Qp=1, the MB type symbol "skip" occurs third most frequently. However, if the conventional method mapping relation in the column marked with UVLC is used, a codeword of code number 2 having a length of 3 bits is used, and therefore the compression efficiency is lowered.

As shown in FIG. 6B, the probability distribution occurrence of symbols can greatly differ from that of the UVLC table. At this time, one factor determining the difference is the quantization interval Qp. Therefore, the present invention prepares one or more mapping tables, which are designed with respect to changes of quantization interval Qp values, as FIGS. 6A and 6B, and uses the mapping tables so that code number A generated by the coding unit 50 is mapped into code number B corresponding to a more efficient codeword. By doing so, the goal of maintaining the advantages of UVLC and improving compression efficiency can be realized. Since the mapping tables need to simply store code number regardless of coding, the mapping tables do not cause additional complexity in implementation.

Figure 7:
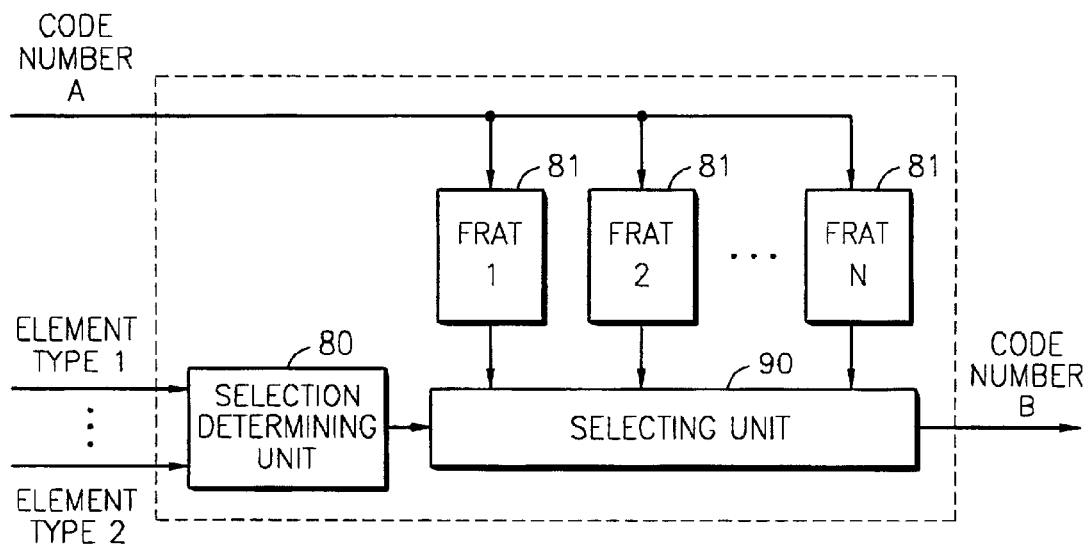
FIG. 7 is a preferred embodiment of a detailed block diagram of the mapper of FIG. 5.

An embodiment of a mapper 60 is shown in FIG. 7. A fixed re-association table (FRAT) 81 observes or predicts optimal coding mapping with respect to conditions, for example, with respect to Qp values, which are provided through the analysis as shown in FIG. 6B, and displays a mapping relation, which is optimized to the provided conditions, in the form of a table. A specific example of FRAT 81 is shown in FIG. 6B. The selecting unit 90 receives code number B from FRATs 81 of respective conditions corresponding to code number A, and then selects code number B output from an appropriate FRAT 81 according to an output signal of a selection determining unit 80 and outputs the selected code number B as the final output code number B. The selection determining unit 80 receives information on element type (Element type 1~Element type N) related to data desired to be coded and generates and outputs a signal for selecting an optimal FRAT 81 based on the received information on element types.

Figure 8:
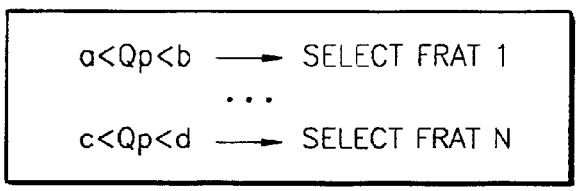
FIG. 8 is an embodiment of an operation of the selection determining unit of FIG. 7.
Figure 9:
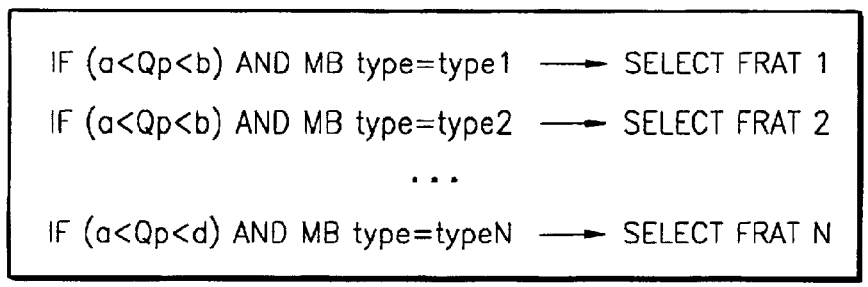
FIG. 9 is another embodiment of an operation of the selection determining unit of FIG. 7.

The operation of the selection determining unit 80 will now be explained. It is assumed that the MB_type of data currently being coded is 16×16, has motion compensation, a Qp of 5, and a signal which is a brightness signal. Then, the selection determining unit 80 receives information on a plurality of element types related to data currently being coded and generates and outputs a signal for selecting an optimal FRAT based on the received several element type information. For example, if data currently being decoded is an MB type symbol, the selection determining unit 80 finds element type information which has the greatest influence on the statistical characteristic of the MB type among the provided several element type information. An example is Qp. That is, a plurality of mapping table FRATs 81, each of which corresponds to one Qp, can be implemented. Otherwise, as shown in FIG. 8, for example, the range for Qp values can be divided into a plurality of ranges so that if Qp is between a and b, FRAT 1 is selected, and if Qp is between c and d, FRAT 2 is selected. At this time, selecting a FRAT 81 using a Qp value is just an example, and the selection determining unit 80 can be implemented in various ways according to necessity, that is, using other element type information or using all information on the plurality of element types. Therefore, the example described above will not restrict the scope of implementation of the present invention in any sense. Another implementation is shown in FIG. 9.

Figure 10:
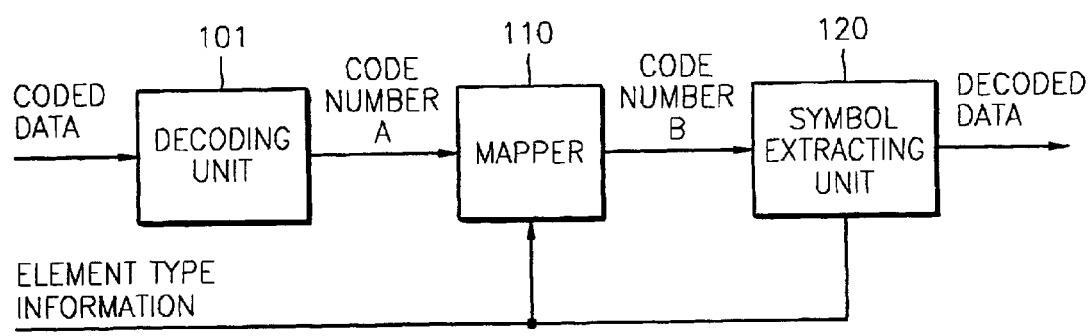
FIG. 10 illustrates the structure of a mapper-based variable length decoding apparatus of the present invention.

FIG. 10 is a block diagram showing the structure of a mapper-based variable length decoding apparatus of the present invention. The operation of the decoding apparatus will now be explained. A decoding unit 101 receives coded data, which is a coded bit stream formed of "0" and "1" and is coded using the mapper-based variable length coding apparatus as shown in FIG. 5. As described above, the decoding unit 101 divides each codeword from the received bit stream and outputs a code number corresponding to each codeword. The code number will be referred to as code number A. This code number is converted into code number B, which is the actual code number used in the coding apparatus, by a mapper unit 110. At this time, the mapper unit 110 receives a signal of element type information, which indicates what symbol is being mapped. Code number B, output by the mapper unit 110, is input to a symbol extracting unit 120, and the symbol extracting unit 120 finds and outputs a predetermined symbol corresponding to the code number B. By doing so, the predetermined decoding is performed. The operation of the mapper unit 110 is the same as that of the mapper 60 of a coding apparatus related to FIG. 5.

Figure 11:
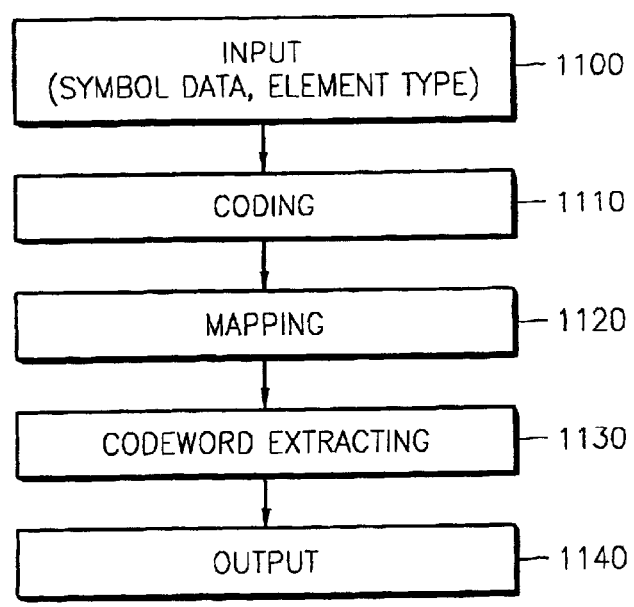
FIG. 11 is a flowchart showing a mapper-based variable length coding method of the present invention.

FIG. 11 is a flowchart showing a mapper-based variable length coding method of the present invention. According to the mapper-based variable length coding method, first, a symbol to be coded and element type information indicating the kind of symbol are received in step 1100. Using INFO bits corresponding to the symbol to be coded, coding by generating a code number corresponding to the INFO bits is performed in step 1110. The generated code number is mapped into another code number which is observationally or theoretically appropriate according to predetermined coding conditions in step 1120. A codeword corresponding to the mapped code number is generated and the codeword is extracted in step 1130. The, extracted codeword is output in step 1140. The mapping step 1120 uses the code number generated in the coding step 1110 and element type information related to the current data. For explanation of the specific operation of coding method of the present invention, refer to the explanation of the operation of the coding apparatus of the present invention.

Figure 12:
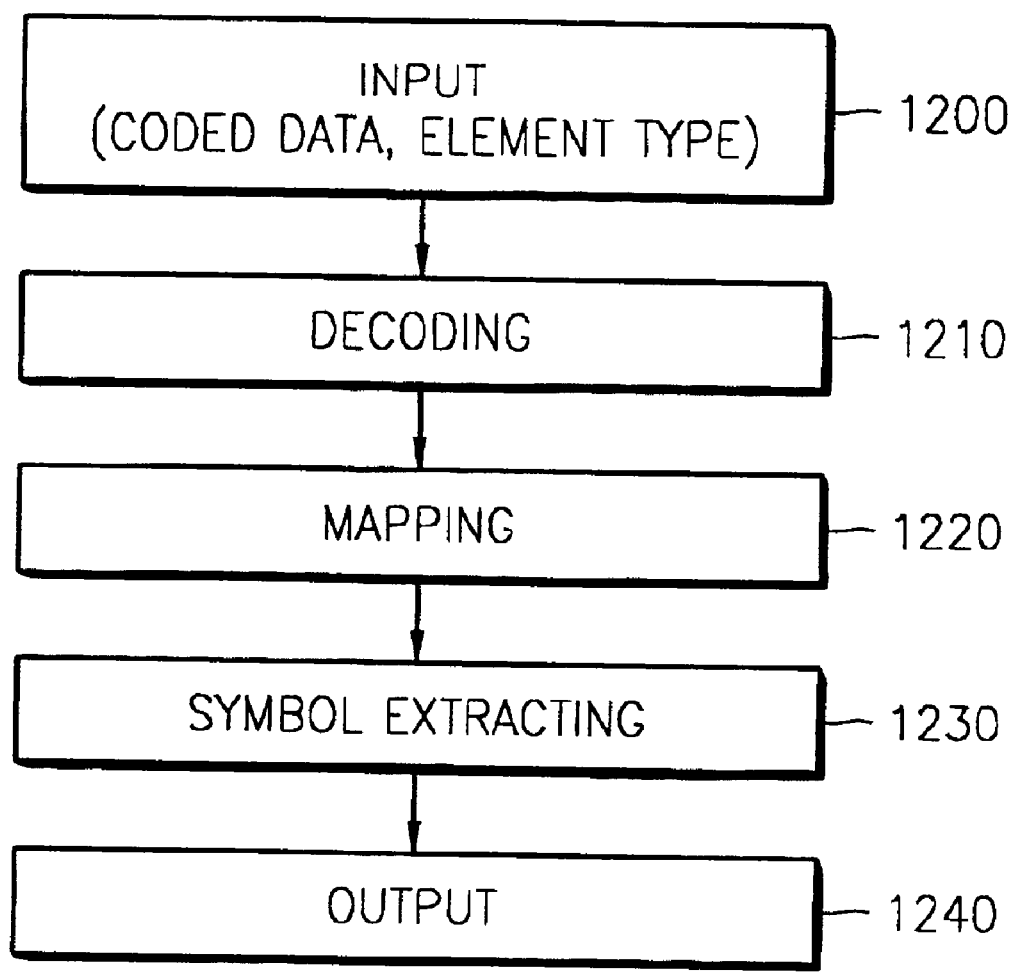
FIG. 12 is a flowchart showing a mapper-based variable length decoding method of the present invention.

FIG. 12 is a flowchart showing a mapper-based variable length decoding method of the present invention. According to the decoding method, first, coded data, which is formed of "0" and "1" and is coded using the coding apparatus, and element type information, which indicates the kind of data, are received in step 1200. Using the input data, decoding by finding a code number corresponding to the input data is performed in step 1210. Mapping for converting thus-found code number into another code number corresponding to a symbol, which is actually coded, using a mapping table for mapping into other code numbers appropriate for element type information, is performed in step 1220. Symbol extraction for finding the original symbol using the code number determined in the mapping step is performed in step 1230. The extracted symbol is output in step 1240. Here, the mapping step 1220 uses the code number generated in the decoding step 1210 and element type information related to the current data. For explanation of the specific operation of decoding method of the present invention, refer to the explanation of the operation of the decoding apparatus of the present invention.

The main fields which the present invention is expected to be applied to in the future include real-time interactive applications for videophones, audio/video communications over mobile networks, video application services in the Internet, real-time signal language and lip-reading communication video transmission, video storage and retrieval for video-on-demand (VOD) services, video storage and forwarding applications for video mail applications, and multipoint communications over heterogeneous networks.

According to the present invention, the advantages of a universal variable length code table can be maintained while preventing efficiency lowering of compression coding.

What is claimed is:

1. A variable length coding method for coding data, the method comprising:

receiving symbol data to be coded and element type information on the kind of symbol data;

generating a first code number corresponding to the received symbol data;

selecting a second code number, mapped with respect to the input element type information and the first code number, in a plurality of mapping tables formed of second code numbers, each of which is appropriately mapped according to first code numbers and element type information;

generating a codeword corresponding to the selected second code number; and outputting the generated codeword.

2. The variable length coding method of claim 1, wherein selecting the second code number comprises selecting a mapping table from among the plurality of mapping tables, each of which corresponds to quantization step (Qp) information corresponding to the symbol data, and generating the second code number from the selected table.

3. The variable length coding method of claim 1, wherein selecting the second code number comprises selecting a mapping table from among the plurality of mapping tables based on information containing at least quantization step (Qp) information, among multiple units of element type information corresponding to the symbol data, and generating the second code number from the selected table.

4. The variable length coding method of claim 1, wherein selecting the second code number comprises selecting the second code number using a mapping table, which makes the least number of generated bits among a plurality of mapping tables.

5. The variable length coding method of claim 1, wherein at least one of the plurality of mapping tables is optimized using a large amount of training data in advance.

6. A variable length decoding method for decoding data, the method comprising:

receiving coded data and element type information containing information on the kinds of coded data;

generating a first code number corresponding to the coded data;

receiving the element type information; and selecting a mapping table among a plurality of mapping tables, each of which corresponds to the first code according to element type information, and generating a second code number corresponding to the first code number by using the selected mapping table.

7. The variable length decoding method of claim 6, wherein the mapping table is selected among the plurality of mapping tables based on information containing at least quantization step (Qp) information among the element type information corresponding to the symbol data.

8. The variable length decoding method of claim 6, wherein at least one of the plurality of mapping tables in the mapping step is optimized using a large amount of training data in advance.

9. A variable length coding apparatus for coding data, the apparatus comprising:

a coding unit for receiving symbol data to be coded, receiving element type information on the kind of the symbol data, and generating a first code number;

a mapper unit for receiving the element type information and the first code number, and generating a second code number corresponding to the first code number in mapping table among a plurality of mapping tables corresponding to the element type information; and a codeword generating unit for generating a codeword corresponding to the second code number and outputting the codeword in the form of coded data.

10. The variable length coding apparatus of claim 9, wherein in the mapping unit, the mapping table is selected based on information containing at least quantization step (Qp) information, among multiple units of element type information corresponding to the symbol data, and the second code number is generated.

11. The variable length coding apparatus of claim 9, wherein in the mapping unit, the mapping table is selected according to quantization step (Qp) information corresponding to symbol data, and the second code number is generated.

12. The variable length coding apparatus of claim 9, wherein in the mapping unit, the second code number is selected using the mapping table, among the plurality of mapping tables, which requires the least number of generated bits.

13. The variable length coding apparatus of claim 9, wherein at least one of the plurality of mapping tables in the mapping unit is optimized using a large amount of training data in advance.

14. A variable length decoding apparatus for decoding coded data, the apparatus comprising:

a decoding unit for receiving coded data, receiving element type information containing information on the kind of coded data, and outputting a first code number;

a mapper unit for receiving the element type information, selecting a mapping table among a plurality of mapping tables, each of which corresponds to one element type, and converting the first code number into a second code number by using the selected table; and a symbol extracting unit for outputting a symbol corresponding to the second code number.

15. The variable length decoding apparatus of claim 14, wherein in the mapping unit, the mapping table is selected according to quantization step (Qp) information corresponding to the symbol data, and a second code number is generated.

16. The variable length decoding apparatus of claim 14, wherein in the mapping unit, the mapping table is selected based on information containing at least quantization step (Qp) information among the element type information corresponding to the symbol data, and the second code number is generated.

17. The variable length decoding apparatus of claim 14, wherein at least one of the plurality of mapping tables in the mapping unit is optimized using a large amount of training data in advance.

\* \* \* \* \*